(12) United States Patent
Choi (10) Patent No.: US 10,381,284 B2
(45) Date of Patent: Aug. 13, 2019

(54) SEMICONDUCTOR PACKAGE (71) Applicant: Samsung Electro-Mechanics Co., Ltd., Suwon-si (KR)

(72) Inventor: Mi Suk Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 219 days.

(21) Appl. No.: 15/457,181

(22) Filed: Mar. 13, 2017

(65) Prior Publication Data

US 2018/0061729 A1  Mar. 1, 2018

(30) Foreign Application Priority Data

Aug. 26, 2016 (KR) .......................... 10-2016-0108951

(51) Int. Cl.
| | |
|---|---|
| *H01L 23/36* | (2006.01) |
| *H01L 23/053* | (2006.01) |
| *H01L 23/498* | (2006.01) |
| *H01L 23/00* | (2006.01) |
| *H01L 23/433* | (2006.01) |
| *H01L 23/552* | (2006.01) |
| *H01L 23/367* | (2006.01) |
| H01L 23/31 | (2006.01) |

(52) U.S. Cl.
CPC ............ *H01L 23/36* (2013.01); *H01L 23/053* (2013.01); *H01L 23/3677* (2013.01); *H01L 23/4334* (2013.01); *H01L 23/49838* (2013.01); *H01L 23/552* (2013.01); *H01L 24/13* (2013.01); *H01L 23/3107* (2013.01); *H01L 2924/0002* (2013.01); *H01L 2924/15311* (2013.01); *H01L 2924/181* (2013.01)

(58) Field of Classification Search
CPC .................................................. H01L 23/3677
See application file for complete search history.

(56) References Cited

U.S. PATENT DOCUMENTS

| | | | |
|---|---|---|---|
| 8,253,236 B2 * | 8/2012 | Oi ....................... | H01L 23/3121 257/150 |
| 8,258,618 B2 * | 9/2012 | Obiraki ................. | H01L 23/142 257/150 |
| 2010/0133681 A1 * | 6/2010 | Oka ....................... | H01L 23/041 257/693 |

FOREIGN PATENT DOCUMENTS

| | | |
|---|---|---|
| JP | 2008-192714 A | 8/2008 |
| JP | 2011-249430 A | 12/2011 |
| JP | 2012-15192 A | 1/2012 |

* cited by examiner

*Primary Examiner* — Yu-Hsi D Sun
(74) *Attorney, Agent, or Firm* — NSIP Law (57) ABSTRACT

A semiconductor package includes a first electronic component disposed on a first surface of a substrate, a first conductive member disposed on the first electronic component, and a sealing member configured to cover the first electronic component and forming a hole to expose the first conductive member to an exterior of the semiconductor package. The semiconductor package also includes a second conductive member disposed on the hole and connected to the first conductive member.

16 Claims, 6 Drawing Sheets

SEMICONDUCTOR PACKAGE

CROSS-REFERENCE TO RELATED APPLICATION

This application claims the benefit under 35 USC 119(a) of Korean Patent Application No. 10-2016-0108951, filed on Aug. 26, 2016 in the Korean Intellectual Property Office, the entire disclosure of which is incorporated herein by reference for all purposes.

BACKGROUND

1. Field

The following description relates to a semiconductor package configured to dissipate heat from an electronic component to the outside.

2. Description of Related Art

As miniaturization and thinning of a semiconductor package have been demanded, a semiconductor package includes a large number of electronic components integrally formed therein. However, because a plurality of electronic components are integrated on a single substrate in such a semiconductor package as that described above, at least one of the electronic components overheats and malfunctions.

Therefore, it is necessary to develop a semiconductor package effectively dissipating heat generated by the electronic components in the semiconductor package.

SUMMARY

This Summary is provided to introduce a selection of concepts in a simplified form that are further described in the Detailed Description below. This Summary is not intended to identify key features or essential features of the claimed subject matter, nor is it intended to be used as an aid in determining the scope of the claimed subject matter.

Examples describe a semiconductor package configured to effectively dissipate heat generated by an electronic component.

In accordance with an embodiment, there is provided a semiconductor package, including: a first electronic component disposed on a first surface of a substrate; a first conductive member disposed on the first electronic component; a sealing member configured to cover the first electronic component and including a hole to expose the first conductive member to an exterior of the semiconductor package; and a second conductive member disposed on the hole and connected to the first conductive member.

The first conductive member may include a first seed layer and a metal layer.

The semiconductor package may also include an oxidation prevention layer formed on the first conductive member and the second conductive member.

The second conductive member may include a second seed layer and a second metal layer.

The semiconductor package may also include a heat radiating member disposed in the sealing member and connected to the first conductive member.

The hole may be formed to have an inclined wall.

The hole may include a first expansion part having a first size and a second expansion part having a second size.

The semiconductor package may also include a second electronic component disposed on a second surface of the substrate.

The semiconductor package may also include an auxiliary substrate disposed on a second surface of the substrate.

In accordance with another embodiment, there is provided a semiconductor package, including: an electronic component disposed on a substrate; a first conductive member disposed on a surface of the electronic component; a sealing member configured to cover the electronic component; a second conductive member extended from a surface of the sealing member toward the first conductive member; and a groove extended from a surface of the second conductive member toward the first conductive member.

The groove may be formed to have an inclined surface.

The semiconductor package may also include a heat radiating member disposed in the sealing member and connected to the second conductive member.

In accordance with a further embodiment, there is provided a semiconductor package, including: a first electronic component disposed on a first surface of a substrate; a first conductive member disposed on the first electronic component; a sealing member formed on the first surface of the substrate and on the first electronic component, wherein a cavity extends through the sealing member to expose a portion of the first conductive member; a second conductive member disposed on an inner surface of the cavity; and an oxidation prevention layer configured to cover the second conductive member and the portion of the first conductive member.

A surface area of the cavity, at the surface of the sealing member, may be larger than an inner base of the cavity.

The cavity may have an inner surface at an incline.

The cavity may include a first expansion part, formed at a position adjacent to the first electronic component, and a second expansion part, formed in at a position adjacent to an outer surface of the sealing member, where the first expansion part may have a smaller diameter than the second expansion part.

The first conductive member and the second conductive member each may include a seed layer and a metal layer.

The seed layer may include silver thiosulfate (STS) and the metal layer may include copper (CU).

The semiconductor package may also include an auxiliary substrate comprising a solder ball and a via electrode, which is connected to a printed circuit of the substrate.

The semiconductor package may also include a second electronic component disposed on a second surface of the substrate, opposite to the first surface, wherein the first electronic component is larger than the second electronic component, and the second electronic component is disposed to be covered entirely or partially by the auxiliary substrate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

It will be understood that when an element or layer is referred to as being "on" or "connected to" another element or layer, it can be directly on or connected to the other element or layer or through intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. These terms do not necessarily imply a specific order or arrangement of the elements, components, regions, layers and/or sections. Thus, a first element, component, region, layer or section discussed below could be termed a second element, component, region, layer or section without departing from the teachings description of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Subsequently, examples are described in further detail with reference to the accompanying drawings.

Figure 1:
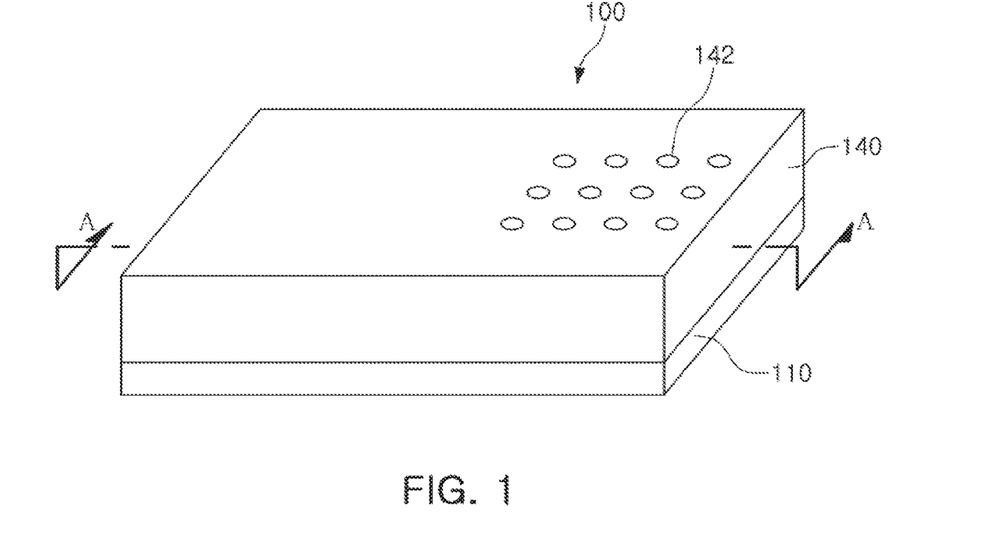
FIG. 1 is a perspective view illustrating a semiconductor package, in accordance with an example.

With reference to FIG. 1, a semiconductor package, according to an example, will be described.

A semiconductor package 100 includes a substrate 110 and a sealing member 140. In addition, the semiconductor package module 100 further includes a solder ball. In addition, the semiconductor package 100 further includes a shield can. The semiconductor package 100 further includes additional components.

The substrate 110 is formed of an insulating material. For example, the substrate 110 is formed of a material such as resin, ceramic, or other materials, such as polyurethane. In addition, the substrate 110 includes a printed circuit (not shown), forming one or more electrical circuits. For example, a first printed circuit is formed on an upper surface of the substrate 110, and a second printed circuit is formed on a lower surface of the substrate 110. The first printed circuit and the second printed circuit are interconnected through a via electrode passing through the substrate 110. However, in an alternative embodiment, the first printed circuit and the second printed circuit are not connected to each other.

The sealing member 140 is formed on the substrate 110. For example, the sealing member 140 is formed on one surface or both surfaces of the substrate 110. The sealing member 140 is formed to have a predetermined height. For example, the sealing member 140 is formed to have a height sufficient to completely cover electronic components 130 disposed on the substrate 110. However, in an alternative embodiment, the sealing member 140 may be formed to cover only a portion of an electronic component 130.

The sealing member 140 is formed of an insulating material. For example, the sealing member 140 is formed of a resin material. However, a material of the sealing member 140 is not limited to being resin. For example, a material of the sealing member 140 may be a mixed material, including a metal powder. In this case, a harmful electromagnetic wave is shielded by the sealing member 140.

In an example, a plurality of holes, cavities, or depressions 142 are formed in the sealing member 140 and extend within the semiconductor package 100. In an embodiment, the sealing member 140 is configured to dissipate heat generated inside the semiconductor package 100.

Figure 2:
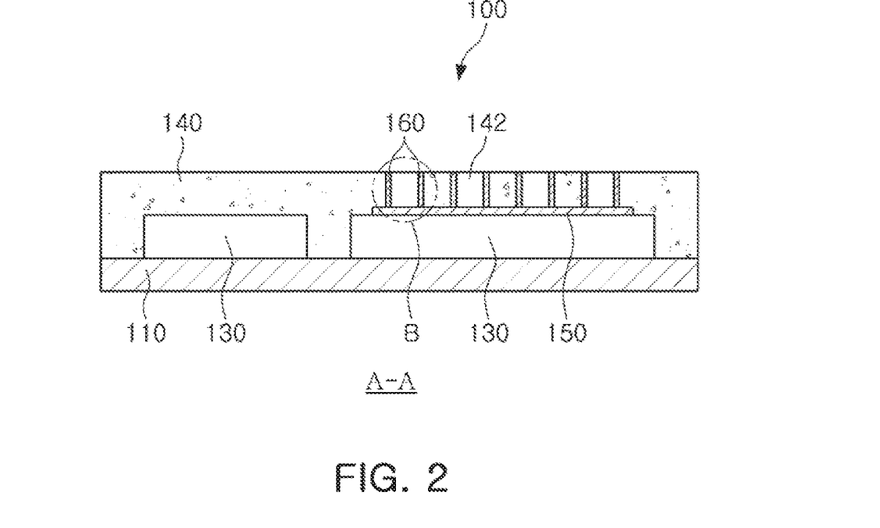
FIG. 2 is a cross-sectional view taken along line A-A of the semiconductor package of the example of FIG. 1.
Figure 3:
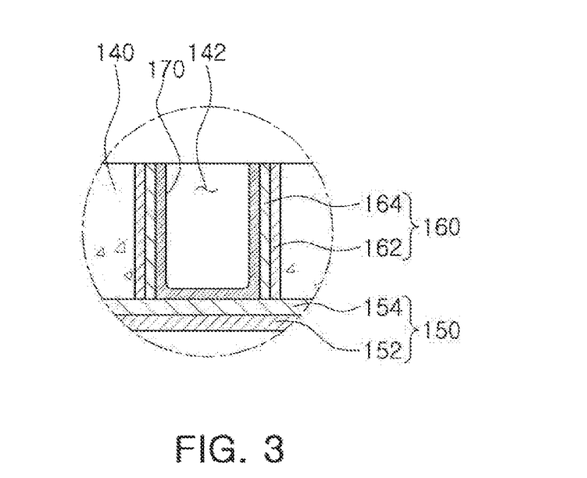
FIG. 3 is an enlarged view of part B of the example of FIG. 2.

With reference to FIGS. 2 and 3, a shape of a cross section of a semiconductor package, according to an example, will be described.

The semiconductor package 100 includes the electronic component 130. For example, one or more electronic components 130 is disposed on the substrate 110. In an embodiment in which electronic components 130 are disposed on the substrate 110, the electronic components 130 are interconnected. For example, the electronic components 130, adjacent to each other, are connected through a printed circuit of the substrate 110.

The semiconductor package 100 is configured to dissipate the heat generated in the electronic component 130. Thus, the semiconductor package 100 includes conductive members 150 and 160, connected to the electronic component 130.

The first conductive member 150 is disposed on the electronic component 130, and the second conductive member 160 is disposed in the sealing member 140.

The first conductive member 150 is disposed on an upper surface of the electronic component 130 substantially covering the upper surface or completely covering the upper surface of the electronic component 130. However, a placement position of the first conductive member 150 is not limited to the upper surface of the electronic component 130. For example, the first conductive member 150 may be formed on a side surface of the electronic component 130 or may be formed on both an upper surface and a side surface of the electronic component 130. The first conductive member 150 may be disposed substantially covering the upper surface and the side surface or completely covering the upper surface and the side surface of the electronic component 130.

The second conductive member 160 is disposed surrounding a hole 142 of the sealing member 140. In addition, the second conductive member 160 is disposed on an inner surface of the hole 142. The second conductive member 160 is connected to the first conductive member 150. For example, the second conductive member 160 extends in a longitudinal direction of the hole 142 to connect to the first conductive member 150.

With reference to FIG. 3, a conductive member will be described in detail.

The conductive members 150 and 160 are formed of a plurality of layers. For example, the conductive members 150 and 160 include seed layers 152 and 162 and metal layers 154 and 164. The seed layers 152 and 162 include silver thiosulfate (STS), and the metal layers 154 and 164 include copper (Cu). However, materials of the seed layers 152 and 162, as well as the metal layers 154 and 164, are not limited thereto.

The conductive members 150 and 160, configured as described above, are firmly formed on, electrically connected to, operatively connected to, or secured to the electronic component 130 and the sealing member 140, to quickly transfer heat generated by the electronic component 130 to an exterior of the semiconductor package 100, thus, dissipating the heat from the electronic component 130.

The semiconductor package 100 further includes a configuration to protect the conductive members 150 and 160. For example, the semiconductor package 100 also includes an oxidation prevention layer 170. The oxidation prevention layer 170 is formed on surfaces of the conductive members 150 and 160. For example, the oxidation prevention layer 170 is formed to cover a portion of the first conductive member 150 exposed to the hole 142 and to cover the second conductive member 160 surrounding the inner surface of the hole 142.

The semiconductor package 100, configured as described in FIGS. 1 through 3, prevents the electronic component 130 from overheating during operation by dissipating the heat produced by the electronic component 130 to an exterior of the semiconductor package 100, through the hole 142 of the sealing member 140 and the conductive members 150 and 160.

Next, semiconductor packages, according to another example, will be described. For reference, in the following description, the same components as those in the above-described example will use the same reference numerals as those in the above-described example, and a detailed description of these components will be omitted.

Figure 4:
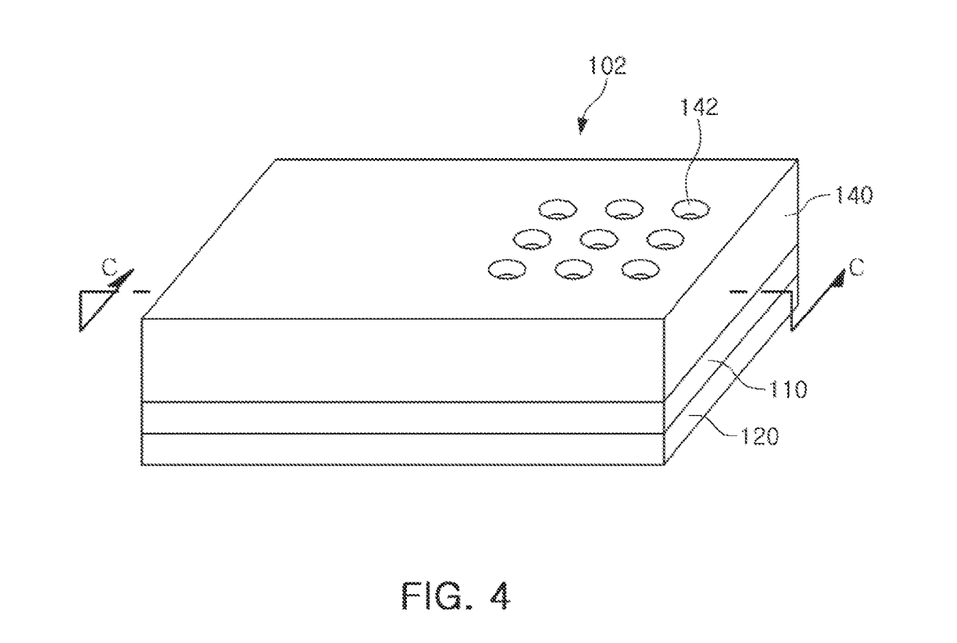
FIG. 4 is a perspective view illustrating a semiconductor package, according to another example.

First, with reference to FIG. 4, a semiconductor package, according to another example, will be described.

A semiconductor package 102, according to an example, is distinguished from the above-described example in a shape of a hole 142 of a sealing member 140. For example, the hole 142 of the sealing member 140 has a shape of an inclined surface.

The semiconductor package 102 includes a substrate 110 and an auxiliary substrate 120. The auxiliary substrate 120 is disposed on a lower surface of the substrate 110.

Figure 5:
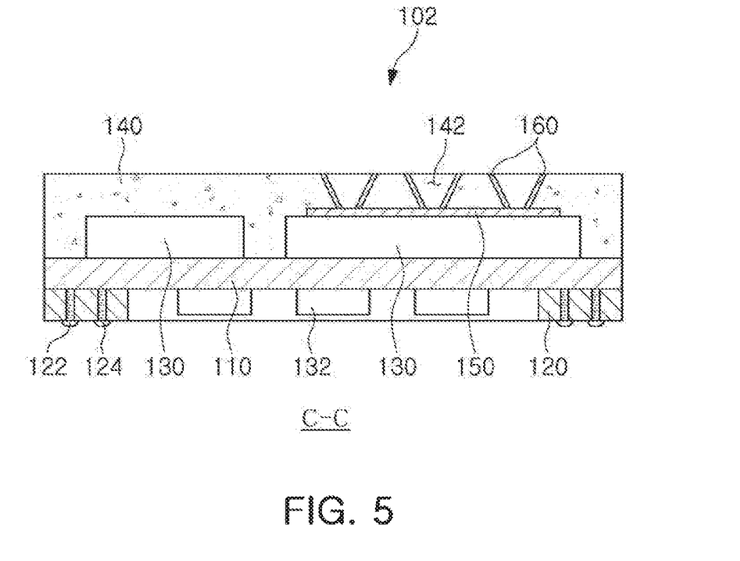
FIG. 5 is a cross-sectional view taken along line C-C of the semiconductor package of the example of FIG. 4.

With reference to FIG. 5, a shape of a cross section of a semiconductor package, according to an example will be described.

The semiconductor package 102, according to an example is distinguished from the above-described example in a form of arrangement of electronic components. For example, in the semiconductor package 102, electronic components 130 and 132 are disposed on an upper part and a lower part of the substrate 110, respectively. In one example, the electronic component 130, which is disposed on an upper or top surface of the substrate 110, is larger than the electronic component 132, which is disposed in a lower surface of the substrate 110. In addition, the electronic component 132 may be disposed in a space covered entirely or partially by or surrounded entirely or partially by the auxiliary substrate 120.

At least some electronic components 130 and 132 may be connected to each other. For example, the electronic component 130 and the electronic component 132 are electrically connected through a printed circuit and a via electrode formed in the substrate 110. However, not all electronic components 130 and 132 need to be interconnected. For example, a portion of the electronic components 130 and 132 may not be electrically connected to other electronic components.

The semiconductor package 102, according to an example, includes the auxiliary substrate 120. The auxiliary substrate 120 includes a via electrode 122 and a solder ball 124. The via electrode 122 is connected to a printed circuit of the substrate 110, and the solder ball 124 is connected to a further semiconductor package or to further electronic devices.

The semiconductor package 102, according to an example, is different from the above-described example by a shape of the hole 142 of the sealing member 140, as described above. The hole 142 of the sealing member 140 has an inner surface at an incline, as illustrated in FIG. 5.

In the semiconductor package 102, a surface area of the hole 142 exposed to the outside is larger than an inner base of the hole 142 exposing the conductive member 150 to effectively dissipate the heat from the electronic component 130.

Figure 6:
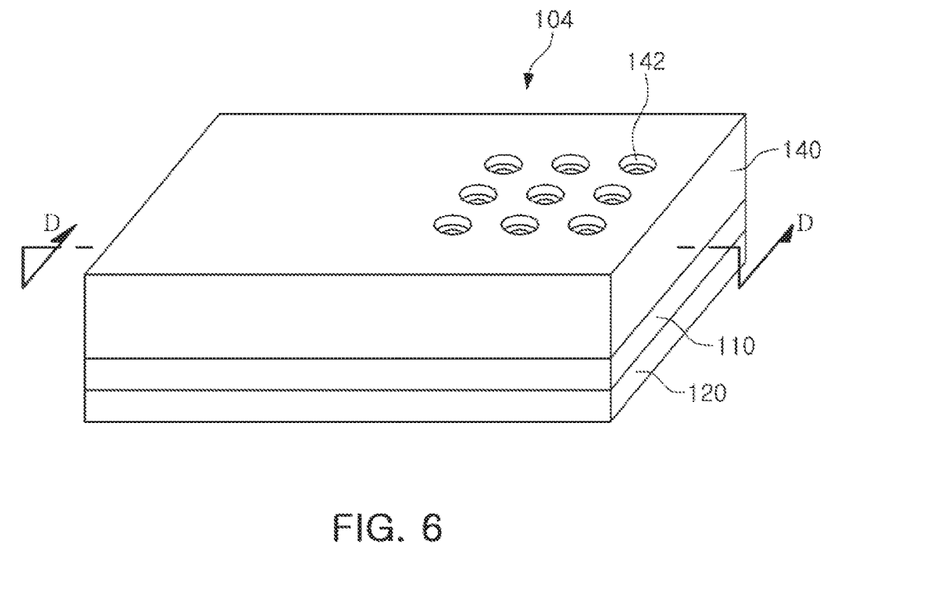
FIG. 6 is a perspective view illustrating a semiconductor package, according to a different example.
Figure 7:
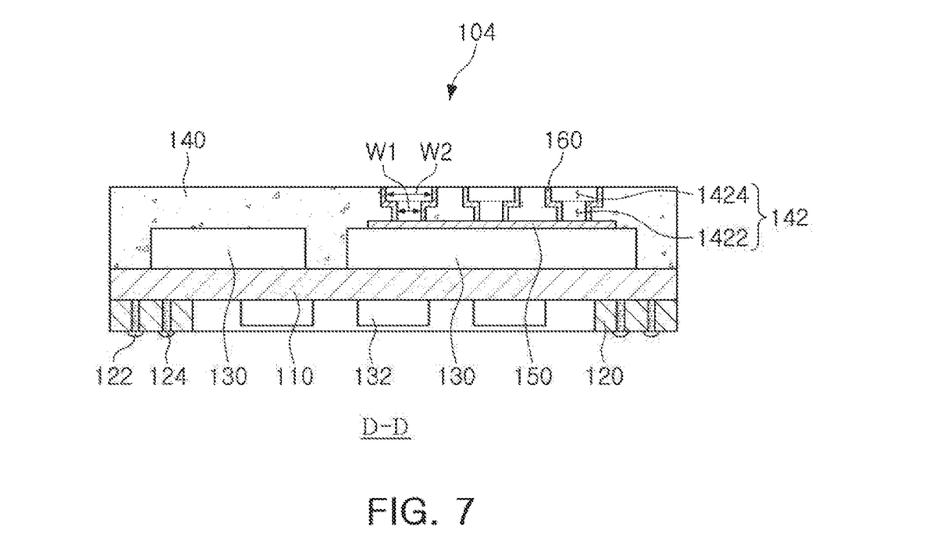
FIG. 7 is a cross-sectional view taken along line D-D of the semiconductor package of the example of FIG. 6.

With reference to FIGS. 6 and 7, a semiconductor package, according to a different example, will be described.

A semiconductor package 104, according to an example, is distinguished from the above-described examples in a shape of the hole 142. For example, in the semiconductor package 104, according to an example, the hole 142 of the sealing member 140 includes a plurality of regions with different cross-sections.

The hole 142 includes a first expansion part 1422 and a second expansion part 1424. The first expansion part 1422 is formed in a part or at a location or at a position adjacent to the electronic component 130, and has a first cross-section W1. The second expansion part 1424 is formed in a part or at a location or at a position adjacent to an outer surface of the sealing member 140, and has a second cross-section W2.

The first expansion part 1422 of the hole 142 is formed to have a smaller diameter than the second expansion part 1424 of the hole 142. At a predetermined height from the electronic component 130 towards an upper and outer surface of the semiconductor package 104 or an upper and outer surface of the sealing member 140, the hole 142 changes to expand to the second expansion part 1424. In other words, the hole 142 has a shape with a cross-section that increases from the electronic component 130 to the upper and outer surface of the sealing member 140.

In the semiconductor package 104 configured as above, a cross-section of the hole 142 expands toward the outer surface of the sealing member 140 to smoothly dissipate heat through the hole 142, as well as the conductive members 150 and 160.

Further, in an example, two expansion areas 1422 and 1424 are described to be formed in the hole 142, but three or more expansion areas may be formed in the hole 142, as needed.

Figure 8:
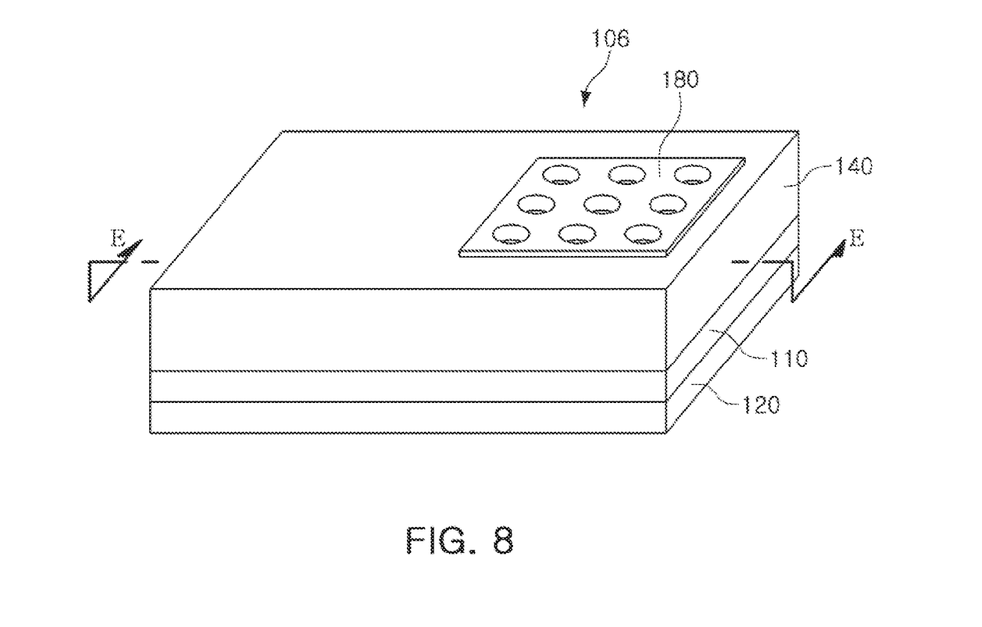
FIG. 8 is a perspective view illustrating a semiconductor package, according to a different example.
Figure 9:
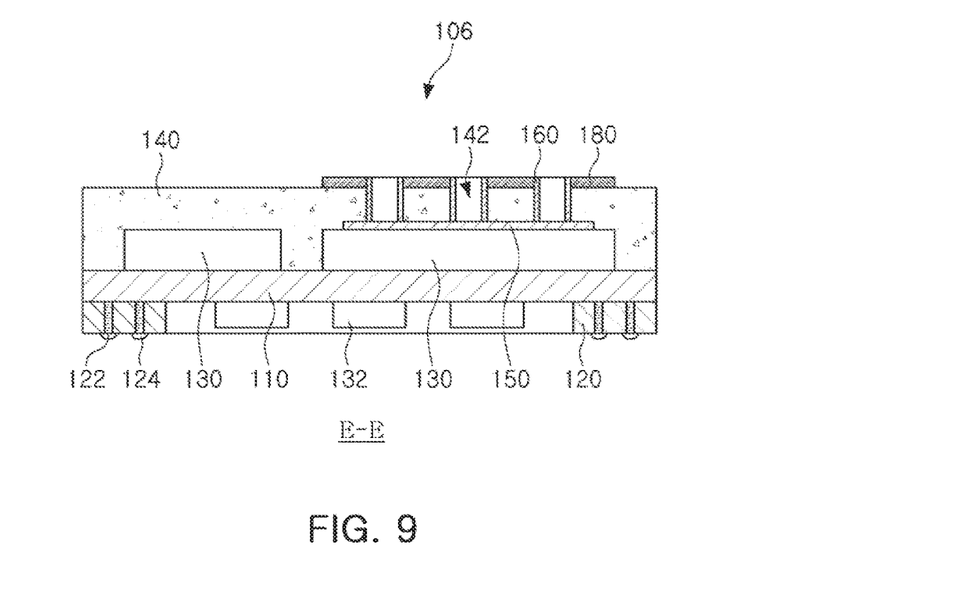
FIG. 9 is a cross-sectional view taken along line E-E of the semiconductor package of the example of FIG. 8.

With reference to FIGS. 8 and 9, a semiconductor package, according to a different example will be described.

A semiconductor package 106, according to an example, further includes a heat radiating member 180. Hereinafter, the heat radiating member 180 will be described in detail.

The heat radiating member 180 is disposed on an upper surface of a sealing member 140. For example, the heat radiating member 180 may be disposed on an upper portion of the sealing member 140. However, a placement position of the heat radiating member 180 is not limited to the upper portion of the sealing member 140. For example, the heat radiating member 180 may be disposed on a side surface of the sealing member 140.

The heat radiating member 180 has a substantially plate shape. For example, the heat radiating member 180 may have a thin plate shape a rectangular or square form. In one example, a thickness or depth of the heat radiating member 180 is substantially smaller than a thickness of the sealing member 140. The heat radiating member 180 has opposite surfaces close together. However, a shape of the heat radiating member 180 is not limited to being a square shape. For example, the heat radiating member 180 may become deformed, to have a circular, elliptical, or polygonal shape.

The heat radiating member 180 is disposed in a region in which the hole 142 is formed. For example, the heat radiating member 180 is disposed to surround a perimeter area in which the hole 142 is formed. Alternatively, a plurality of heat radiating members 180 are disposed at intervals to include entire perimeter areas in which multiple holes 142 are formed. Although a single heat radiating member 180 is illustrated and described that surrounds each and every area defining the holes 142, in accordance with an alternative example, multiple heat radiating members 180 may be implemented to surround at least one area defining the holes 142.

The heat radiating member 180 is connected to conductive members 150 and 160. For example, the heat radiating member 180 is electrically connected to the second conductive member 160, which is formed in an inner surface of the hole 142 to electrically connect the heat radiating member 180 to the first conductive member 150, therethrough.

In the semiconductor package 106 as describe, heat of the electronic component 130 is widely released to the outside of the sealing member 140 through the heat radiating member 180, connected to the conductive members 150 and 160, and thus an overheating phenomenon of the electronic component 130 is effectively prevented.

Figure 10:
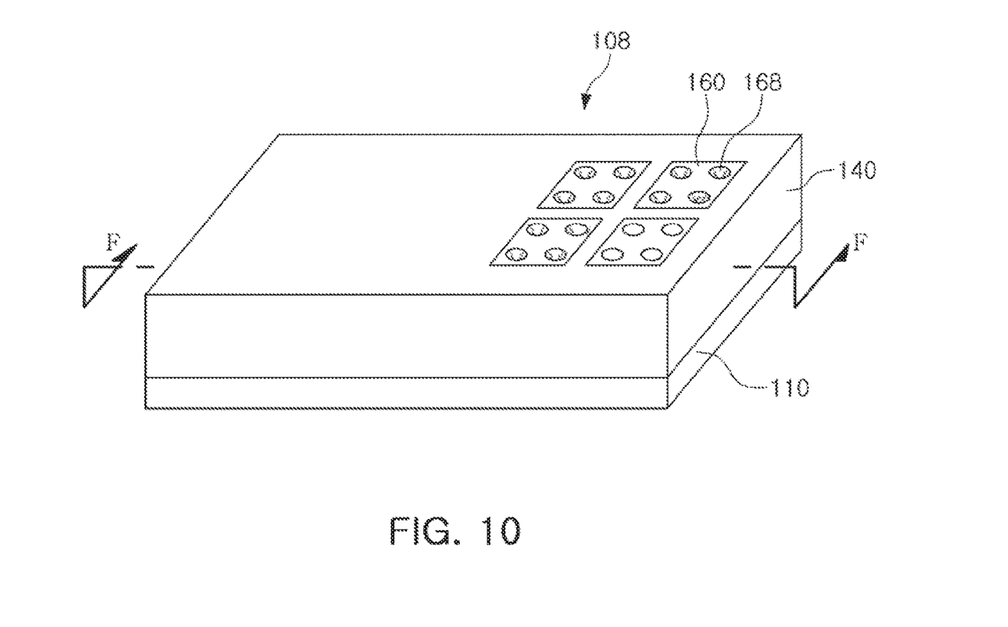
FIG. 10 is a perspective view illustrating a semiconductor package, according to a different example.
Figure 11:
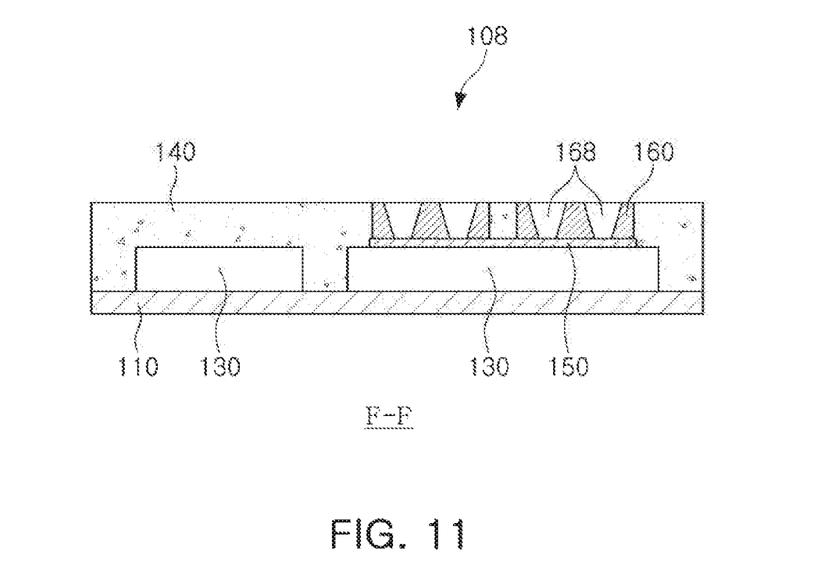
FIG. 11 is a cross-sectional view taken along line F-F of the semiconductor package of the example of FIG. 10.

With reference to FIGS. 10 and 11, a semiconductor package, according to a different example, will be described.

A semiconductor package 108, according to an example, is distinguished from the above-described examples in a shape of a second conductive member 160.

The second conductive member 160 includes a shape that completely fills an open space of a sealing member 140. The second conductive member 160 is connected to a first conductive member 150. For example, the second conductive member 160 extends from a surface of the sealing member 140 to the first conductive member 150.

The second conductive member 160 expands a heat dissipating area. For example, a plurality of grooves, cavities, or depressions 168 are formed in the second conductive member 160. A groove 168 is formed to be elongated, from a surface of the second conductive member 160 in a direction towards the first conductive member 150. For example, the groove 168 is formed to have a depth sufficient to expose a surface of the first conductive member 150. However, the depth of the groove 168 is not limited to having a size sufficient to expose the first conductive member 150.

The semiconductor package 108, configured as above, simplifies a process of forming the second conductive member 160.

As set forth above, in accord with some of the many advantages associated with the examples thus described, a malfunction caused by heating of a semiconductor package may be significantly reduced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package, comprising:
a first electronic component disposed on a first surface of a substrate;
a first conductive member disposed on the first electronic component;
a sealing member configured to cover the first electronic component and comprising a hole to expose the first conductive member to an exterior of the semiconductor package; and
a second conductive member disposed on the hole and connected to the first conductive member;
wherein the second conductive member comprises a second seed layer and a second metal layer.

2. The semiconductor package of claim 1, wherein the first conductive member comprises a first seed layer and a metal layer.

3. The semiconductor package of claim 1, further comprising:
an oxidation prevention layer formed on the first conductive member and the second conductive member.

4. The semiconductor package of claim 1, further comprising:
a heat radiating member disposed in the sealing member and connected to the first conductive member.

5. The semiconductor package of claim 1, wherein the hole is formed to have an inclined wall.

6. The semiconductor package of claim 1, wherein the hole comprises a first expansion part having a first size and a second expansion part having a second size.

7. The semiconductor package of claim 1, further comprising:
a second electronic component disposed on a second surface of the substrate.

8. The semiconductor package of claim 1, further comprising:
an auxiliary substrate disposed on a second surface of the substrate.

9. A semiconductor package, comprising:
a first electronic component disposed on a first surface of a substrate;
a first conductive member disposed on the first electronic component;
a sealing member formed on the first surface of the substrate and on the first electronic component, wherein a cavity extends through the sealing member to expose a portion of the first conductive member;
a second conductive member disposed on an inner surface of the cavity; and
an oxidation prevention layer configured to cover the second conductive member and the portion of the first conductive member;
wherein the second conductive member comprises a second seed layer and a second metal layer.

10. The semiconductor package of claim 9, wherein a surface area of the cavity, at the surface of the sealing member, is larger than an inner base of the cavity.

11. The semiconductor package of claim 9, wherein the cavity has an inner surface at an incline.

12. The semiconductor package of claim 9, wherein the cavity comprises a first expansion part, formed at a position adjacent to the first electronic component, and a second expansion part, formed in at a position adjacent to an outer surface of the sealing member, where the first expansion part has a smaller diameter than the second expansion part.

13. The semiconductor package of claim 9, wherein the first conductive member comprises a first seed layer and a first metal layer.

14. The semiconductor package of claim 13, wherein the first and second seed layers comprise silver thiosulfate (STS) and the metal layer comprises copper (CU).

15. The semiconductor package of claim 9, further comprising:
an auxiliary substrate comprising a solder ball and a via electrode, which is connected to a printed circuit of the substrate.

16. The semiconductor package of claim 15, further comprising:
a second electronic component disposed on a second surface of the substrate, opposite to the first surface, wherein the first electronic component is larger than the second electronic component, and the second electronic component is disposed to be covered entirely or partially by the auxiliary substrate.

* * * * *